United States Patent [19]

Laderman et al.

[11] Patent Number: 5,256,550
[45] Date of Patent: Oct. 26, 1993

[54] FABRICATING A SEMICONDUCTOR DEVICE WITH STRAINED $SI_{1-x}GE_x$ LAYER

[75] Inventors: Stephen Laderman, Menlo Park; Martin Scott, San Francisco; Theodore I. Kamins, Palo Alto; Judy L. Hoyt, Palo Alto; Clifford A. King, Palo Alto; James F. Gibbons, Palo Alto; David B. Noble, Sunnyvale, all of Calif.

[73] Assignee: Hewlett-Packard Company, Palo Alto, Calif.

[21] Appl. No.: 715,054

[22] Filed: Jun. 12, 1991

Related U.S. Application Data

[63] Continuation of Ser. No. 344,634, Apr. 27, 1989, abandoned, which is a continuation-in-part of Ser. No. 277,593, Nov. 29, 1988.

[51] Int. Cl.$^5$ .............................. H01L 21/205
[52] U.S. Cl. .................... 437/106; 437/131; 148/DIG. 15; 156/613; 156/614; 156/DIG. 64; 156/DIG. 67
[58] Field of Search ............... 156/DIG. 64, DIG. 67, 156/613, 614; 437/131, 106; 148/DIG. 15, DIG. 59, DIG. 72, DIG. 97

[56] References Cited

U.S. PATENT DOCUMENTS

| | | | |
|---|---|---|---|
| 4,529,455 | 7/1985 | Bean et al. | 437/105 |
| 4,617,724 | 10/1986 | Yokoyama et al. | 437/133 |
| 4,771,013 | 9/1988 | Curran | 437/31 |
| 4,772,924 | 9/1988 | Bean et al. | 357/4 |
| 5,084,411 | 1/1992 | Laderman et al. | 437/131 |

OTHER PUBLICATIONS

Wolf, "Silicon Processing for the VLSI Era", vol. 1, 1986, Lattice Press, p. 198.
Ghandhi, "VLSI Fabrication Principles", 1983, John Wiley and Sons, p. 385.
Lee et al., ". . . Molecular-Beam Epitaxy Grown GaAs-on-Si", J. Vac. Sci. Technol., B5(3), May/Jun. 1987, pp. 827–830.
King et al. ". . . Epitaxially Grown Si P-N Junctions Fabricated Using Limited Reaction Processing", IEEE, Elec. Device Letters, vol. 9, No. 5, May 1988, pp. 229–231.
Bean et al., ". . . Growth of $Ge_xSi_{1-x}$ on Silicon by Molecular Beam Epitaxy", Appl. Phys. Lett. 44(1), 1 Jan. 1984, pp. 102–104.
Gibbons et al., "Limited Reaction Processing: Silicon and III-V Materials", Mat. Res. Soc. Supp., vol. 92, 1987, pp. 281–294.

(List continued on next page.)

Primary Examiner—Robert Kunemund
Assistant Examiner—Ourmazd S. Ojan

[57] ABSTRACT

The present invention comprises a method of fabricating devices and circuits employing at least one heteroepitaxial layer under strain. The thickness of the heteroepitaxial layer is more than two times the calculated equilibrium critical thickness for an uncapped heteroepitaxial layer upon a crystalline substrate, based on previously known equilibrium theory for the uncapped layer. Subsequent to growth of the heteroepitaxial layer, the structure is processed at temperatures higher than the growth temperature of the heteroepitaxial layer.

The strained heteroepitaxial layer (second layer) is epitaxially grown upon the surface of a first, underlaying crystalline layer, creating a heterojunction. Subsequently a third crystalline layer is deposited or grown upon the major exposed surface of the second, strained heteroepitaxial layer. The preferred manner of growth of the third crystalline layer is epitaxial growth. The composition of the third crystalline layer must be such that upon deposition or growth, the third layer substantially continuously binds to the heteroepitaxial structure of the second layer. Subsequent to growth of the at least three layer structure, the structure is processed at temperatures in excess of the growth temperature of the second heteroepitaxial layer. Presence of the third crystalline layer prevents the generation of a substantial amount of misfit dislocations between the first crystalline layer substrate and the second heteroepitaxial layer.

18 Claims, 2 Drawing Sheets

OTHER PUBLICATIONS

King et al., "Si/Si$_{1-x}$Ge$_x$ Heterojunction Bipolar Transistors...", IEEE Electron Device Lett., vol. 10, No. 2, Feb. 1989, pp. 52–54.

Gronet et al., "Growth of GeSi/Si Strained-Layer Superlattices...", J. Appl. Phys., 61(6), 15 Mar. 1987, pp. 2407–2409.

Temkin et al., "Ge$_x$Si$_{1-x}$ Strained-Layer Heterostructure Bipolar Transistors," Appl. Phys. Lett., 52(13), 28 Mar. 1988, pp. 1089–1091.

Lee et al., "Epitaxy of GaAs on Si: MBE and OMCVD," Mat. Res. Soc. Symp., vol. 91, 1987, pp. 33–45.

C. A. King et al., "Si/Si$_{1-x}$Ge$_x$ Heterojunction Bipolar Transistors Produced by Limited Reaction Processing", IEEE Electron Device Letters, vol. 10, Feb. 1989, pp. 52–54.

D. L. Harame, et al., "High Performance Si and SiGE-Base PNP Transistors", Tech. Digest, International Electron Devices Meeting, San Francisco, Dec. 1988, pp. 889–891.

J. W. Matthews, et al., "Defects in epitaxial Multilayers", Journal of Crystal Growth 27 (1987) pp. 118–125.

Y. Kohama et al., "Determination of the Critical Layer Thickness of Si$_{1-x}$Ge$_x$/Si Heterostructures by Direct Observation of Misfit Dislocations", Appl. Phys. Letter 52 (5), Feb. 1, 1988, pp. 380–382.

G. L. Patton et al., "Silicon-Germanium-Base Heterojunction Bipolar Transistors by Molecular Beam Epitaxy", Electron Device Letters, vol. 9, No. 4, Apr. 1988, pp. 165–167.

J. F. Gibbons et al., "Limited Reaction Processing: Silicon Epitaxy", app. Phys. Lett. vol 47, (1985), pp. 721–723.

R. Hull and A. Fischer-Colbrie "Nucleation of GaAs on Si: Experimental evidence for a three-dimensional critical transition" *Applied Physics Letters*, vol. 50, No. 13, Mar. 30, 1987, pp. 851–853.

J. W. Lee et al. "Defect reduction by thermal annealing of GaAs layers grown by molecular beam epitaxy on Si Substrates" *Applied Physics Letters*, vol. 50, No. 1, Jan. 5, 1987, pp. 31–33.

FABRICATING A SEMICONDUCTOR DEVICE WITH STRAINED SI$_{1-x}$GE$_x$ LAYER

This is a continuation of copending U.S. patent application Ser. No. 07/344,634, filed Apr. 27, 1989, now abandoned. The latter application was a continuation-in-part application of copending U.S. patent application Ser. No. 07/277,593, filed Nov. 29, 1988.

BACKGROUND OF THE INVENTION

1. Field of the Invention

This invention pertains to a method of maintaining the structural integrity and thus the strain within at least one heteroepitaxial layer which is bound to an adjacent layer of a different material, forming a heterojunction. Typically such strained heteroepitaxial layers are useful in the fabrication of semiconductor structures such as bipolar transistors and infrared wavelength photodetectors. However, upon subsequent processing of the structures at temperatures higher than the heteroepitaxial layer growth temperature, the strained heteroepitaxial crystal tends to relax, forming dislocations at the heterojunction. The dislocations, combined with the decrease in strain of the heteroepitaxial layer, result in reduced performance of semiconductor devices. The present invention provides a method for processing the semiconductor device at temperatures greater than the strained heteroepitaxial layer growth temperature while maintaining the structural integrity at the heterojunction and the strain within the heteroepitaxial layer, so that the overall performance characteristics of the device are improved.

2. Background of the Invention

Multilayer structures comprising heterojunctions are useful in the fabrication of numerous different electron and optoelectronic devices, one of the most significant electron devices being bipolar transistors. In a typical bipolar transistor, useful charge carriers travel from an emitter region through a base region to a collector region. The bipolar transistor can be of an NPN type, wherein the collector is an N type material, the base is a P type material, and the emitter is an N type material. (P type material refers to a material predominated by positive carriers (holes), whereas N type material refers to a material predominated by negative charge carriers (electrons).) The bipolar transistor can alernatively have the opposite polarity and be of a PNP type, wherein the collector is a P type material, the base in an N type material, and the emitter is a P type material.

It is possible to have the P and N type materials be comprised of one basic crystalline material such as silicon, which is doped to enable each region to function in the desired manner. In such a homojunction transistor, made using one crystalline material such as silicon, the emitter and base doping levels influence the efficiency with which carriers are injected from the emitter. Some charge carriers which are majority carriers in the base portion of the structure and minority carriers in the emitter portion of the structure can be injected from the base to the emitter, degrading the overall efficiency of the transistor. One method of lessening this problem is to use a different crystalline material to form the base region that the crystalline material used to form the emitter region. This results in formation of an interface between one crystalline layer and another which is referred to as a heterojunction. In the case of bipolar transistors, the heterojunction is useful in blocking the injection of one type of carrier from the base to the emitter.

Heterostructures comprising heterojunctions such as Si$_{1-x}$Ge$_x$/Si can be used for both majority-carrier and minority-carrier devices. One of the major proposed applications is for a heterojunction bipolar transistor (HBT), in which the Si$_{1-x}$Ge$_x$ layer serves as the base of the bipolar transistor. Recent progress with the strained-layer epitaxy of Si$_{1-x}$Ge$_x$ alloys on silicon has generated excitement over the prospect of an HBT which is compatible with existing silicon process technology. The high emitter injection efficiency brought about by the heterojunction in a Si/Si$_{1-x}$Ge$_x$ HBT offers a number of advantages. HBTs have been fabricated from layers epitaxially deposited by chemical vapor deposition (CVD) techniques including limited reaction processing (LRP), a technique that relies on rapid changes in substrate temperature to achieve abrupt doping and compositional profiles.

One description of Si/Si$_{1-x}$Ge$_x$ Heterojunction Bipolar Transistors Produced by Limited Reaction Processing is presented in a paper by that title authored by C. A. King, et al. which was published in the IEEE Electron Device Letters, Vol. 10, No. 2, February 1989, pp. 52-54. This paper is hereby incorporated by reference, since it provides a good description of the kind of process within which the method of the present invention can be used, and after the disclosure of the present invention, one skilled in the art will be able to provide more flexibility in the production of HBTs. The metastability of strained Si$_{1-x}$Ge$_x$ layers on silicon was discussed in this paper by C. A. King, et al. and it was pointed out that special care was taken to ensure that post layer growth processing steps chosen minimized thermal exposure of the base layer.

Another example of the use of SiGe-Base transistors is disclosed in a paper by D. L. Harame, et al., entitled: "High Performance Si and SiGe Base PNP Transistors", Tech. Digest, International Electron Devices Meeting, San Francisco, December 1988, p. 889. Heterojunction PNP fransistors with Si$_{1-x}$Ge$_x$-bases were fabricated. Molecular Beam Epitaxy (MBE) was used to deposit both the Si substrate and Si$_{1-x}$Ge$_x$-base layers and the emitter was formed by low temperature epitaxy. Low temperature processing was used in general after the MBE growth of the SiGe-bases.

To gain maximum advantage from the Si$_{1-x}$Ge$_x$ base layer of a given thickness, it is necessary to incorporate as much Ge (i.e., have as great an x value) as is consistent with good epitaxial crystal quality of the Si$_{1-x}$Ge$_x$ layer. The ideal quality is attained if the Si$_{1-x}$Ge$_x$ layer is grown with the lattice planes of the underlying silicon continuing into the Si$_{1-x}$Ge$_x$ layer. To the degree that the interface is, in this sense coherent, it will necessarily be found that the Si$_{1-x}$Ge$_x$ layer is strained. This strain is known to further enhance the performance of the HBT by increasing the difference between the Si and Si$_{1-x}$Ge$_x$ bandgaps. It is therefore desirable to maintain the strained condition during subsequent processing of the structure to the finished devices and circuits.

In the past, such subsequent processing was highly constrained to low temperatures and short time periods at temperature to maintain the conditions of the coherent lattice interface and the strained Si$_{1-x}$Ge$_x$ crystal. The processing constraints were based on the knowledge that misfit dislocations may occur across the interface between a substrate and a strained epitaxial film grown on the substrate. For example J. W. Matthews and A. E. Blakeslee, in their paper entitled: "Defects in Epitaxial Multilayers", Journal of Crystal Growth 27 (1974) pp. 118-125, described misfit dislocations in epitaxial multilayers. Multilayers composed of many thin films of GaAs and GaAsP were grown epitaxially on GaAs surfaces. Examination of the multilayers by transmission and scanning electron microscopy revealed that the interfaces between layers were made up of large coherent areas separated by long straight misfit dislocations. These dislocations are the mechanism by which the strain in a crystalline layer relaxes.

For a heteroepitaxial layer of a given composition in a given structure, there is a calculated critical thickness, based on equilibrium theory (which is a function of the bonding and strain energy of bonded atoms in the crystalline lattice structure). When the heteroepitaxial layer thickness is below the critical thickness, the amount of energy required to relax the strain and to create dislocations at the heterojunction (heterointerface) is sufficiently large that the crystalline layer can be processed at high temperatures (exceeding the growth temperature of the crystalline layer) without relaxing the strain or creating dislocations at the heterojunction. When the heteroepitaxial layer thickness exceeds the critical thickness and the layer is processed at high temperatures, misfit dislocations appear with an accompanying strain relaxation and lowering of the energy level in the heteroepitaxial layer. In the cases studied by Matthews and Blakeslee, the layer thicknesses at which misfit dislocations were formed were in satisfactory agreement with the predicted, calculated critical thickness. Once the calculated critical thickness of epitaxial layer growth was exceeded, dislocation generation occurred. The calculated critical thickness depends on the overall structure comprising the heteroepitaxial layer. For example, the calculated critical thickness for a heteroepitaxial $Si_{1-x}Ge_x$ layer between two thick silicon layers is nearly twice the calculated critical thickness for the same layer on a Silicon substrate by itself.

When the composition of the heteroepitaxial layer is altered, for a given layer thickness, dislocations would be expected to occur as soon as the composition is such that the critical thickness for a heteroepitaxial layer of that composition is exceeded. Subsequent to the work done by Matthews and Blakeslee, Y. Kohama et al. published information about the critical layer thickness of $Si_{1-x}Ge_x/Si$ heterostructures in a paper entitled: "Determination of the critical layer thickness of $Si_{1-x}Ge_x/Si$ heterostructures by direct observation of misfit dislocations", in Appl. Phys. Lett. 52(5), Feb. 1, 1988, p.380. The interest in development of $Si_{1-x}Ge_x/Si$ superlattices was attributed to their potential applications in the fields of infrared photodetectors and field-effect transistors. One of the significant parameters in designing these devices was said to be the critical layer thickness of the $Si_{1-x}Ge_x$ layers grown on silicon substrates. The critical layer thickness strongly depends on the lattice mismatch between $Si_{1-x}Ge_x$ and Si. In general, the mismatch is accomodated by elastic strain when the heteroepitaxial layer thickness is less than the critical thickness. When the heteroepitaxial layer thickness is greater than the critical thickness, the lattice mismatch is accommodated by elastic strain and misfit dislocations. The paper presents data related to the critical thickness of $Si_{1-x}Ge_x$ on a silicon substrate as a function of x, the germanium content of the silicon-germanium crystal.

The following U.S. Patents, which are related to the subject matter of the present invention, provide insight into the kinds of semiconductor devices which employ strained heteroepitaxial layers. In addition, fabrication process limitations are discussed which show the unexpectedness of the discovery which led to the present invention.

U.S. Pat. No. 4,529,455 to Bean et al., dated Jul. 16, 1985, discloses a method for epitaxially growing $Ge_x Si_{1-x}$ layers on Si utilizing molecular beam epitaxy. The subject matter of this patent is hereby incorporated by reference.

U.S. Pat. No. 4,617,724 to Yokoyama et al., dated Oct. 21, 1986, discusses a process for fabricating heterojunction bipolar transistors with low base resistance. This patent discloses numerous semiconductor structures and discusses the manner in which they function. Several different types of heteroepitaxial layers and heterojunctions are discussed.

U.S. Pat. No. 4,771,013 to Curran, dated Sep. 13, 1988 discloses a process of making a double heterojunction 3-D $I^2L$ bipolar transistor with a Si/Ge superlattice. Described is a three dimensional, bipolar wafer process for integrating high voltage, high power, analog and digital circuitry. The structure formed by the process includes a wafer of non-compensated epitaxial strata on a heavily donor doped monocrystalline silicon substrate of <100> crystal orientation, which is etched and with three dimensional transistors formed on it.

U.S. Pat. No. 4,772,924 to Bean et al., dated Sep. 20, 1988, describes a semiconductor device having a strain induced region of altered bandgap. A strained layer superlattice comprising $Ge_x Si_{1-x}$ layers interleaved with silicon layers provides an excellent photodetector at infrared wavelengths due to the large shift in bandgap caused by the strain in the superlattice.

U.S. Pat. No. 4,529,455 to Bean, referenced above, discusses the growth conditions for molecular beam epitaxy whereby epitaxial thin films of $Si_{1-x}Ge_x$ may be grown on silicon or germanium substrates for values of x within the range from 0.0 to 1.0. Relatively thick, smooth layers are said to be grown provided the substrate temperature during deposition is within a critical range, the substrate is properly cleaned prior to growth and has a low dislocation density, and the vacuum is a pressure of $5 \times 10^{-8}$ Torr or less. The substrate temperature is required to be 550° C. or less for values of x greater than 0.5. For smaller values of x, the growth temperature is permitted to increase, with allowed substrate temperatures being permitted to increase to a value of approximately 650° C. for x less than 0.5. Depending upon the precise value of x, pseudomorphic growth conditions can be maintained for layer thicknesses up to the critical layer thickness, beyond which dislocation-free material cannot be grown.

It is known in the art that it is possible to grow substantially misfit-dislocation-free $Si_{1-x}Ge_x$ epitaxial films at temperatures near 650° C. for thicknesses more than two times the calculated critical thickness for a single uncapped heteroepitaxial layer. To date there is no generic theory which accurately predicts the relationship between the amount of lattice distortion which may persist at a heterojunction interface between layers of different crystalline composition. Determinations regarding distortion and dislocations have been made empirically for each epitaxial layer/substrate combination, typically as a function of varying composition of the epitaxial layer. It is believed, however, that if the thickness of an epitaxially grown layer upon a substrate is below the critical thickness for that epitaxial layer, the structure can be exposed for extended periods of time to the given temperature, even though that temperature is above the growth or deposition temperature of the epitaxial layer, without the substantial formation of or growth of existing dislocations between the epitaxial layer and the substrate.

Often it is desired to use an epitaxial layer thickness which is greater than the critical thickness to obtain particular device functions or performance levels. However, if single layers of $Si_{1-x}Ge_x$ are grown on silicon, wherein the germanium fractional content x is greater than or equal to the critical concentration for the layer thickness, upon heating the layered structure above the growth temperature of the $Si_{1-x}Ge_x$ layer there is rapid relaxation of the strain in the $Si_{1-x}Ge_x$ layer and the formation of dislocations at the heterojunction, consistent with equilibrium theory. The problem of dislocations between the epitaxially grown layer of one composition and the substrate of a different composition and the relaxation of the strain desired in the epitaxially grown layer have been overcome by using maximum processing temperatures subsequent to the growth of the heteroepitaxial layer which are about the same as the growth temperature of the epitaxial layer. Or, if the subsequent processing temperature is greater than the growth temperature of the heteroepitaxial layer, the temperature used is as low as possible and the time period the temperature is used is less than a minute (typically seconds). Prior to this invention, it has been supposed that all processing above the growth temperature of a heteroepitaxial layer thicker than its calculated critical thickness degrades the layer and thus compromises device performance.

Since it is desired to use higher processing temperatures in subsequent processing steps and to use heteroepitaxial layer thicknesses greater than the critical thicknesses determined for the layer of epitaxially grown crystal on its substrate, it is desired to find a method of maintaining the structural integrity at the heterojunction and the strain in the heteroepitaxial layer during subsequent processing at temperatures greater than the strained heteroepitaxial layer growth temperature.

SUMMARY OF THE INVENTION

The present invention comprises a method of fabricating devices and circuits employing at least one heteroepitaxial layer under strain (which layer is bonded to an adjacent layer of a different material forming a heterojunction). The thickness of the heteroepitaxial layer is more than two times the calculated equilibrium critical thickness for an uncapped heteroepitaxial layer upon a crystalline substrate. The fabrication process includes the use of temperatures higher than the growth temperature of the strained heteroepitaxial layer, subsequent to the growth of this layer.

The strained heteroepitaxial layer (second layer) is epitaxially grown upon the surface of a first, underlaying layer, creating a heterojunction. Subsequently, a third crystalline layer is deposited or grown upon the exposed surface of the second, strained heteroepitaxial layer. The preferred manner of growth of the third crystalline layer is epitaxial growth. The composition of the third crystalline layer must be such that, upon deposition or growth, the third layer substantially continuously binds to the heteroepitaxial structure of the second layer. Covalently bonded, epitaxially grown third crystalline layers are expected to perform well in stabilizing the structural orientation of the second, strained heteroepitaxial layer. Any epitaxially grown crystalline material can be used for the third crystalline layer as long as this material is not under a substantial amount of strain. In the preferred embodiment of the present invention, the third crystalline layer is as unstrained as possible, and thus, an epitaxial layer substantially lattice matched to the first crystalline layer is preferred.

When the first underlaying layer is comprised principally of silicon, the second, strained heteroepitaxial layer is comprised principally of $Si_{1-x}Ge_x$, and the third, overlaying crystalline layer is comprised principally of silicon, bonding of the third layer of silicon to the second, strained layer of $Si_{1-x}Ge_x$ occurs substantially continuously across the crystalline interface. Typically the second, strained heteroepitaxial layer of $Si_{1-x}Ge_x$ is epitaxially grown upon the first layer of silicon at temperatures ranging from about 500° C. to about 650° C. Lower temperatures can be used for growth of the second, strained heteroepitaxial layer depending on the equipment available. However, as the growth temperature decreases, the quality of the crystal may change. Use of lower deposition temperatures for the second, strained heteroepitaxial layer permits growth of a thicker layer prior to the onset of the formation of dislocations at the interface between the $Si_{1-x}Ge_x$ layer and the underlying silicon layer. The third crystalline layer is preferably deposited at a temperature about the same as that used to deposit the second, strained crystalline layer. However, it is possible to grow the third crystalline layer at higher temperatures. For example, in some HBTs grown by LRP, the third crystalline layer was deposited at a relatively high temperature (about 850° C. for about 3 minutes) compared with the growth temperature of the second heteroepitaxial layer (about 625° C.).

As previously stated, by growing the strained heteroepitaxial layer at lower temperatures and by modern nonequilibrium growth techniques, it is possible to grow this layer thicker than the thermodynamically stable critical thickness. The problem then becomes one of how to subsequently process the structure at a higher temperatures without relaxation of the strain in the crystal and without the creation of dislocation defects at the interface between the first crystalline layer and the second, strained heteroepitaxial layer. Calculation of the energy balances within the crystalline lattice indicated that application of a third crystalline layer over the second, strained heteroepitaxial layer changed the overall equilibrium of the structure, increasing the critical thickness for the heteroepitaxial layer to two times the critical thickness for the heteroepitaxial layer alone on a first underlaying layer.

It has presently been discovered that epitaxial growth of a third, "capping" layer, comprising principally silicon over the second, strained layer of $Si_{1-x}Ge_x$, leads to preservation of the strain within the heteroepitaxial layer during subsequent, prolonged high temperature processing, even when the heteroepitaxial layer is at least four times the calculated critical thickness for the "uncapped" heteroepitaxial layer alone on the first underlaying layer. Thus it is possible to process a capped structure comprising the strained $Si_{1-x}Ge_x$ layer at thicknesses up to at least four times the calculated critical thickness for an uncapped second heteroepitaxial layer, at temperatures as high as 1,000° C., without significant relaxation of the strain or creation of dislocation defects at the interface between the strained $Si_{1-x}Ge_x$ layer and its silicon substrate layer. It has also been discovered that such processing (subsequent to growth of the heteroepitaxial layer) can be done for at least several minutes at 1,000° C. and for at least one hour at 950° C. It is unexpected that use of an overlaying third layer to restrain the relaxation of the strained heteroepitaxial layer would make possible the high temperature processing for extended time periods of strained layers of up to at least four times the critical thickness of an uncapped layer. Specific examples of the kinds of subsequent processing steps which can be carried out over the higher processing temperature range which can be utilized within the present invention, and which could not have been carried out within the 600° C. processing temperature range previously recommended, are presented in the detailed description of the present invention.

It is believed that the thickness of the third, overlaying silicon layer does not have a substantial effect on the thickness of strained $Si_{1-x}Ge_x$ layer which can be used, unless the third overlaying silicon layer is too thin. For example, it appears that a thickness less than about 200 Angstroms is insufficient.

DESCRIPTION OF THE PREFERRED EMBODIMENTS

Multilayer structures comprising heterojunctions are useful in the fabrication of numerous different electron and optoelectronic devices. Devices such as bipolar transistors and infrared photodetectors have been of special interest. The multilayer structures can comprise low dislocation density heteroepitaxial layers such as silicon-germanium. If grown nearly defect-free, heteroepitaxial layers such as gallium arsenide, germanium-tin, indium-phosphide, and indium-antimonide can be useful also. This detailed discussion is limited to heteroepitaxial layers comprised of $Si_{1-x}Ge_x$ which can today be grown essentially dislocation-free using chemical vapor deposition (CVD) techniques such as limited reaction processing (LRP). However, the concepts discussed and the preferred embodiments described could be applied to other systems and growth processes wherein equivalent quality heteroepitaxial layers can be obtained.

Figure 1:
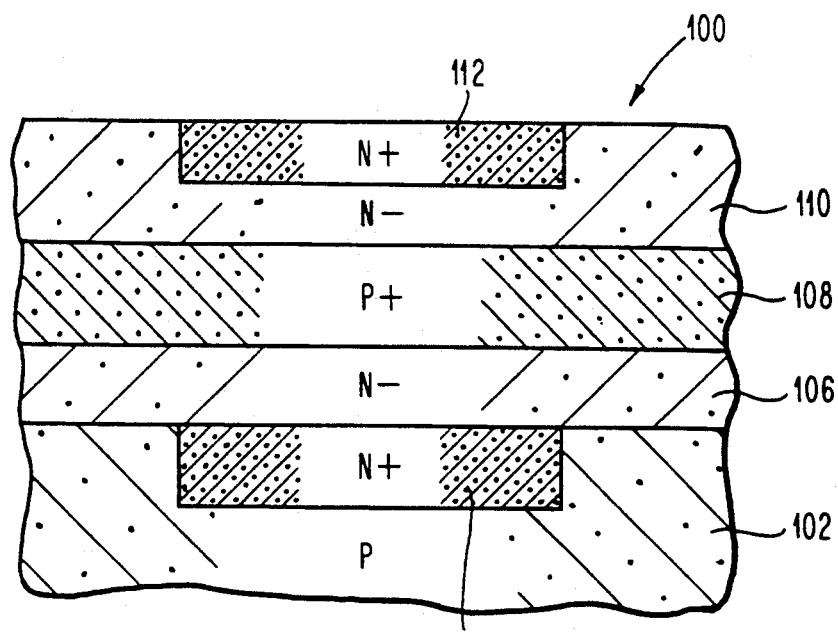
FIG. 1 is a schematic elevation view of a structure fabricated in accordance with the present invention.

The heteroepitaxial layers comprised of $Si_{1-x}Ge_x$ are of special interest because they can be used to extend silicon technology to heterojunction bipolar transistors, as previously discussed. In a heterojunction bipolar transistor, a $Si_{1-x}Ge_x$ layer can serve as the base of the bipolar transistor. FIG. 1 shows one possible heterojunction bipolar transistor structure of an N-P-N type, comprising a P type substrate 102 in the form of a silicon wafer. Oxidation, photolithographic techniques, and ion implantation can be used to create an isolated subcollector region 104, which is typically highly (about $10^{18} cm^{-3}$) doped with an N type dopant such as arsenic or antimony. Subsequent to creation of subcollector region 104, a layer of epitaxial silicon 106 is grown over the surface of the silicon wafer structure. Epitaxial silicon layer 106 is lightly (about $10^{16} cm^{-3}$) doped with an N type dopant such as arsenic or phosphorus which enables layer 106 to function as a collector for the bipolar transistor. Next, a heteroepitaxial layer 108 of $Si_{1-x}Ge_x$ is grown over the surface of episilicon layer 106. $Si_{1-x}Ge_x$ layer 108, which is highly (about $10^{18} cm^{-3}$ to about $10^{20} cm^{-3}$) doped using a P-type dopant such as boron, serves as the base for the bipolar transistor. A layer of epitaxially grown silicon 110 is then grown over the surface of $Si_{1-x}Ge_x$ layer 108. Epitaxial silicon layer 110 is doped during epitaxial growth with an N type dopant such as arsenic or phosphorus to a level ranging from about $10^{17} cm^{-3}$ to about $10^{19} cm^{-3}$. Further, region 110 is ion implanted with arsenic in a thin surface region 112 which is to function as an aid in making the contact to the emitter for the bipolar transistor. Epitaxial silicon layer 110 serves to restrain $Si_{1-x}Ge_x$ layer 108 from strain relaxation and aids in the prevention of dislocation defects at the interface between layers 106 and 108 during subsequent device processing.

Figure 2:
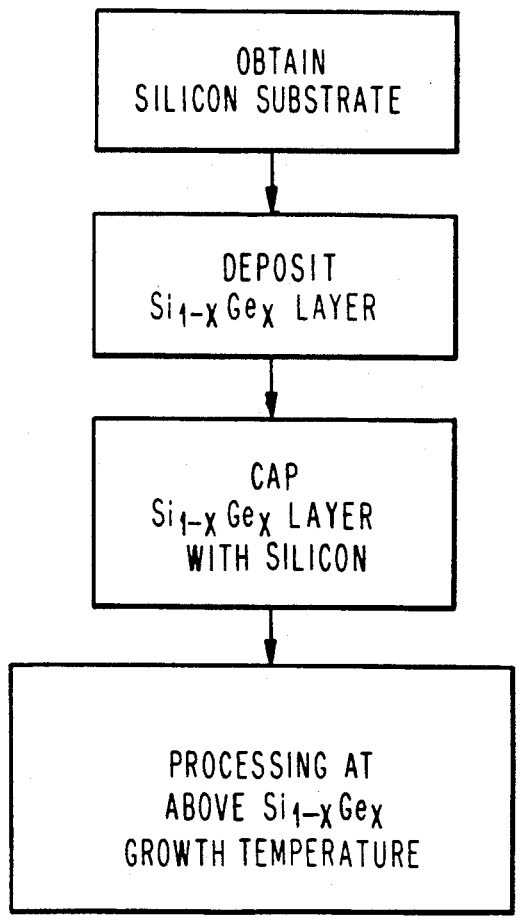
FIG. 2 is a flow chart of the method used to fabricate the structure of FIG. 1 and the circuits employing such structures.

The thickness of $Si_{1-x}Ge_x$ layer 108 depends on the device requirements, but typically ranges from about 200 Angstroms to about 1,000 Angstroms, depending on the germanium content(x) of the heteroepitaxial layer. An example of typical 108 layer thicknesses which would be desirable for use in semiconductor structures follows. For a germanium content of about 30%, the thickness of layer 108 can be as great as about 300 Angstroms, whereas for a germanium content of about 20%, the thickness of layer 108 can be as great as about 500 Angstroms. It is desired to use a high-germanium-content, low-thickness layer to obtain preferred transistor performance characteristics. Germanium contents ranging from about 5 percent to about 50 percent can be used; however, presently the most commonly used range of germanium content is from about 12 percent to about 35 percent. The typical thickness of epitaxial silicon layer 110 ranges from greater than about 200 Angstroms to about 5,000 Angstroms. The growth temperature for epitaxial silicon layer 110 is typically at least as high as the growth temperature for $Si_{1-x}Ge_x$ layer 108; the growth temperature should be as low as possible and still be consistent with the requirement for substantially continuous bonding of epitaxially grown silicon layer 110 to $Si_{1-x}Ge_x$ layer 108. It is preferred to keep the growth temperature of layer 110 low enough to substantially minimize strain relaxation. However, once an adequate thickness of layer 110 is obtained, the growth temperature can be increased to grow the desired final thickness of the layer 110. FIG. 2 shows a flow chart of the critical method steps used in fabrication of the structure shown in FIG. 1.

The $Si/Si_{1-x}Ge_x/Si$ structure can function as a transistor in two different manners. The emitter can be either the silicon layer above the $Si_{1-x}Ge_x$ layer (called an emitter-up structure) or the silicon layer below the $Si_{1-x}Ge_x$ layer (called an emitter-down structure). The discontinuity at the emitter-base junction reduces reverse injection of the base majority carrier into the emitter, thereby allowing higher doping in the base to reduce base resistance while not degrading the emitter injection efficiency. Although the preceding description is for an N-P-N transistor, the concept is applicable to a P-N-P transistor upon changing dopant type in each layer.

$Si/Si_{1-x}Ge_x/Si$ heterojunction bipolar transistors can be incorporated into an integrated circuit in several different ways. Typical examples are given below, but the concept of using the thermal stability of the $Si/Si_{1-x}Ge_x/Si$ structure to allow integrated realizations containing heterojunction bipolar transistors is more general, and integrated circuits can be formed by many different techniques.

An integrated circuit is frequently comprised of a number of bipolar transistors. It is necessary to have isolation regions between the transistors, and many of the processes for forming the isolation regions require process temperatures in excess of the growth temperature of the $Si_{1-x}Ge_x$ strained layer. The higher the temperature at which the $Si/Si_{1-x}Ge_x/Si$ structure can be processed, the greater the flexibility in designing the integrated circuit fabrication process. The maximum temperature used in integrated circuit processing is about 1,200° C. Typically temperatures lower than 1,100° C. are adequate, and the availability of processing temperatures up to 1,000° C. still provides considerable flexibility. Prior to discovery of the present invention, limitation of process temperatures after growth of the $Si/Si_{1-x}Ge_x/Si$ to about 550° C. or less was recommended, as disclosed in an article entitled: "Silicon-Germanium-Base Heterojunction Bipolar Transistors By Molecular Beam Epitaxy", published in Electron Device Letters, Vol.9, No. 4, April 1988, pp. 165-167.

Trench isolation can be used to combine the transistors into an integrated circuit, as discussed above. In this technique, a silicon substrate is prepared which contains a heavily doped layer or separated regions which are used to lower the collector series resistance. (The terminology used in this description is applicable to an emitter-up structure, but interchanging the words emitter and collector should make it applicable to the emitter-down structure). The $Si/Si_{1-x}Ge_x/Si$ structure is formed upon the substrate. Subsequently, a masking material is formed on the top surface of the $Si/Si_{1-x}Ge_x/Si$ structure. Narrow openings are defined in the masking material by lithography and are etched through the masking material and the epitaxial layers. The resulting recesses are then filled with an insulating material (e.g., $SiO_2$) or by a combination of an insulating and a noninsulating material (e.g., $SiO_2$ and polysilicon). After the excess material is removed from the top surface, a separation between the base and collector contact region can be formed, and contacts to the base, emitter, and collector are made. Metallization completes fabrication of the integrated circuit. This method of forming integrated realization of a heterojunction transistor requires only moderately high temperature processing steps (e.g., 900° C. for perhaps 30 min.) and is compatible with the increased thermal stability of the $Si/Si_{1-x}Ge_x/Si$ structure used in the practice of the method of the present invention.

Nitride layers which are used as insulators and as etch masks in integrated circuit processing can be grown over a temperature range from about 700° C. to about 850° C. Titanium silicides, used to provide conductive layers can be formed over a temperature range from about 700° C. to about 900° C. These materials can be used in a process compatible with the increased thermal stability discussed above.

The increased thermal stability of the $Si/Si_{1-x}Ge_x/Si$ structure can also permit use of a local oxidation silicon process (LOCOS), when the LOCOS oxide can be formed at about 850° C. or less. Using this technique, a thin stress-relief oxide layer and an oxidation-masking layer of silicon nitride are formed over the entire surface of the $Si/Si_{1-x}Ge_x/Si$ structure, and the oxide and silicon nitride layers are then removed from the regions which are to become the isolation regions. An oxide is grown in the regions of exposed silicon, to isolate adjacent elements of the integrated circuit. Oxidation at a relatively low temperature, in the range of about 800° C., (e.g., by high-pressure oxidation at about 10 to 25 atmospheres) makes this isolation process compatible with the demonstrated stability of the $Si/Si_{1-x}Ge_x/Si$ structure of the present invention. After forming the isolation regions, the transistor structure can be completed using methods well known in the art with only slightly restricted thermal cycles.

In another potential integration technique, an isolation structure can be formed before the $Si_{1-x}Ge_x$ layer is grown. For example, isolation regions can be formed by thermal oxidation and etching or by a trench process or by other common techniques without any thermal limitations beyond those of conventional silicon thermal processing. The epitaxial layers can subsequently be grown on the partially processed wafer by at least two methods. The $Si/Si_{1-x}Ge_x/Si$ layers can be deposited selectively in the exposed regions of a silicon substrate with little or no deposit of the layers on the isolation regions. Alternatively, the $Si/Si_{1-x}Ge_x/Si$ layers can be grown over the entire wafer; they are epitaxial (i.e., substantially single-crystal) over the exposed silicon regions and polycrystalline over the isolation regions. In another technique, some layers can be grown selectively only over the exposed regions, and subsequent layers can be grown over both the exposed regions and the isolation regions. Deposition or lack of deposition on the isolation regions can be controlled by proper selection of the reactant gases and reactor conditions used to grow the epitaxial layers.

In view of the applications available for strained heteroepitaxial layers, such as those described above, substantial interest has arisen in the development of methods for enhancing the thermal stability of structures containing the strained heteroepitaxial layers. In addition, recent advances in analytical technology have made it possible to more accurately analyze the factors which affect the stability of the strained heteroepitaxial layers. The amount of relaxation which occurs in the strained crystal lattice and the number of dislocations at the interface between the strained crystal and the substrate upon subsequent processing of the structure depend substantially on factors such as the thickness of the strained crystal layer, the overall composition of the strained layer, the compositional difference between the strained crystal layer and the substrate crystal, the purity of the strained crystal layer, and the temperature and growth techniques used during growth of the strained crystal layer. The latter three factors listed above affect the perfection of the single crystal which comprises the strained crystal layer. The thermal stability of both uncapped and epitaxial-silicon capped structures of $Si_{1-x}Ge_x$ upon a silicon substrate have been characterized by X-ray topography and transmission electron microscopy. The observed stability at the interface between the $Si_{1-x}Ge_x$ heteroepitaxial layer and its silicon substrate has been compared with the stability predicted by equilibrium theory.

Past measurements of the generation of misfit dislocations during growth of $Si_{1-x}Ge_x$ have focused on epitaxial layers grown by molecular beam epitaxy (MBE). Some of these studies have used Rutherford backscattering (RBS) and x-ray diffraction to characterize the onset of strain relaxation. The sensitivity of these techniques is not sufficient to study the early stages of misfit dislocation generation. A combination of techniques has been used to characterize individual dislocations in as-grown MBE samples (See E. P. Kvam, et al., Materials Research Society Symposium Proceedings Volume 104, p. 623 (1988). See also Y. Kohama et al., Appl. Phys. Lett. Vol 52, p. 380 (1988). The combination of analytical techniques including X-ray topography and transmission electron microscopy, has made possible characterization of the individual dislocations in as-grown MBE samples.

$Si_{1-x}Ge_x$ materials have also been grown by limited reaction processing (LRP), a CVD technique that relies on the rapid heating and cooling of the substrate to initiate and terminate growth (See J. F. Gibbons, et al., App. Phys. Lett., vol. 47, p. 721 (1985) which is hereby incorporated by reference). Prior to the present work, no comparison had been made between $Si_{1-x}Ge_x$ formed by MBE and that formed by chemical vapor deposition (CVD). Present data indicates the LRP-grown strained $Si_{1-x}Ge_x$ layers may have increased stability over the stability of strained $Si_{1-x}Ge_x$ layer materials grown by MBE. The improved stability may be due to formation of a more perfect crystal by LRP. The LRP-formed $Si_{1-x}Ge_x$ crystal films have been found to contain approximatley $10^{20}$ oxygen atoms per $cm^3$. However, the effect of the oxygen atoms on the stability of the strained $Si_{1-x}Ge_x$ crystal layer is not well defined at this time.

Heteroepitaxial layers of $Si_{1-x}Ge_x$ were grown by LRP having a germanium mole fraction $x=0.21$ as measured by Rutherford backscattering (RBS). These films were grown at 625° C. using $GeH_4$ and $SiH_2Cl_2$ in an apparatus that has been described by Gibbons et al. Thicknesses were found by RBS to range from about 500 to about 2000 Angstroms. The heterocrystalline layers capped with silicon were prepared by growing approximately 2000 Angstroms of silicon at about 840° C. at a growth rate of about 8 Angstroms per second on top of the layer of $Si_{0.79}Ge_{0.21}$. Epitaxial structures were also grown by MBE with a measured Ge mole fraction $x=0.15$ at a growth temperature of 520° C. Both sets of films were grown on {001}-oriented silicon substrates.

Annealing studies were performed in-situ for some of the LRP samples and in a commercially available Rapid Thermal Anneal (RTA) unit for both LRP and MBE samples. Times and temperatures were chosen to study the early stages of misfit dislocation generation.

Misfit dislocation spacings were measured directly using X-ray topography, plan-view transmission electron microscopy, and cross section transmission electron microscopy. In combination, these techniques have the required sensitivity to study individual misfit dislocations of arbitrary spacing. When average spacings less than 50 micrometers are mentioned in this description, the spacings were determined by TEM; when greater spacings are mentioned, they were estimated from topographs. The X-ray topographs were taken in transmission using a rotating anode X-ray generator and a Lang camera with $Cuk_{a1}$ radiation. The (220) and (400) type substrate reflections were employed. This arrangement enabled misfit dislocations to be studied with epitaxial films as thin as 500 Angstroms. A JEOL 200 CX TEM was used to image the dislocations in plan view. Care was taken to analyze the same wafer area with all techniques employed to minimize the effects of spatial variations in alloy composition and thickness. Diffraction imaging techniques were chosen instead of electron-beam-induced-current (EBIC) techniques, to avoid ambiguity introduced by possible differences in the electrical activity of the dislocations.

Figure 3:
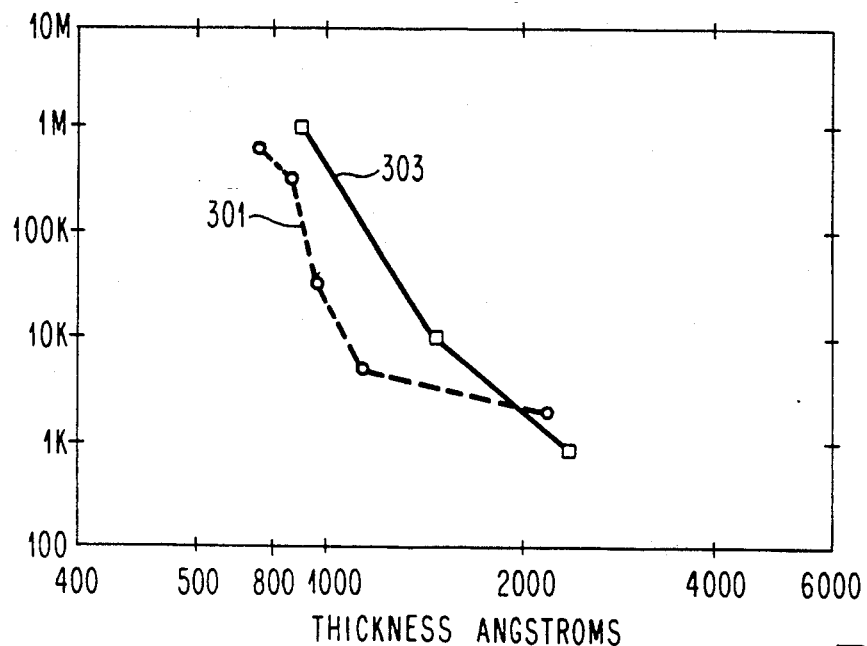
FIG. 3 is a graph of dislocation spacing (the inverse function of dislocation density) as a function of thickness in LRP $Si_{0.79}Ge_{0.21}$ films. Curve 301 denotes undoped films, and curve 303 denotes boron doped films, having a boron [B] concentration of about $10^{19} cm^{-3}$.
Figure 4:
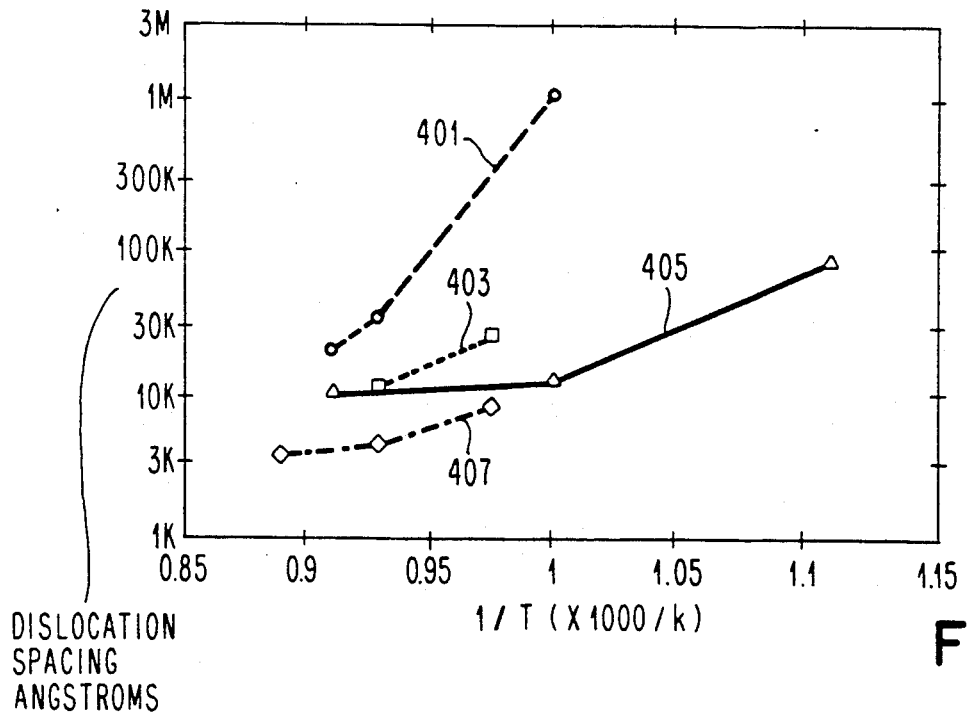
FIG. 4 is a graph showing dislocation spacings measured after annealing uncapped $Si_{1-x}Ge_x$ films. MBE films had a composition of x=0.15; LRP films, x=0.21. Curve 401 denotes 4 min. anneals of 550 Angstrom thick LRP films, curve 403 denotes 1 hr. anneals of 410 Angstrom thick LRP films, curve 405 denotes 4 min. anneals of 550 Angstrom thick MBE films, and curve 407 denotes 1 hr. anneals of 630 Angstrom thick LRP films. In contrast with the data shown in FIG. 4, there was no significant increase in dislocation density after annealing capped LRP samples (x=0.21, 500 Angstrom thick $Si_{1-x}Ge_x$ layer) annealed up to one hour at 900° C.

The test results for as-grown dislocation spacings showed that uncapped LRP samples were substantially dislocation-free at thickness up to 550 Angstroms. Misfit dislocations were observed at a thickness of of about 800 Angstroms, and the spacing between misfit dislocations decreased with increasing layer thickness as shown in FIG. 3, which represents dislocation spacings measured before annealing $Si_{1-x}Ge_x$ films, where $x=0.2$. Line 301 denotes undoped films. Line 303 denotes boron doped films, with a dopant concentration of about $10^{19}cm^{-3}$. The test results regarding the effects of post-growth annealing showed the mean dislocation spacing in uncapped LRP and MBE films decreased as the annealing temperature was increased from 625° C. to 825° C. Data presented in FIG. 4 show the temperature dependence of the mean misfitdislocation spacing after annealing. MBE films had a composition of $x=0.15$ and LRP films had a composition of $x=0.21$. Line 410 denotes four minute anneals of 550 Angstroms thick LRP films; line 403 denotes 1 hour anneals of 410 angstrom thick LRP films; line 405 denotes 4 minute anneals of 550 Angstrom thick MBE films; and line 407 denotes 1 hour anneals of 630 Angstrom thick LRP films. In contrast, there was no significant increase in misfit dislocation density after annealing of capped heteroepitaxial LRP samples at 625° C., ($x=0.21$, 550 Angstrom thick LRP $Si_{1-x}Ge_x$ layers). Capped heteroepitaxial MBE samples contained misfit dislocations with an average spacing of about 9 micrometers after annealing at 625° C.

A silicon cap was effective in reducing the rate of misfitdislocation generation during annealing. Although the capped LRP samples contained misfit dislocations with an average spacing of about 6 micrometers as grown, there was no significant increase in the dislocation density after annealing for one hour at temperatures up to 900° C. Quantification of the as-grown misfit dislocation density in LRP samples formed at 625° C. showed the thickness at which such defects appear to be about five times the critical thickness predicted by equilibrium theory for an uncapped sample. By growing the heteroepitaxial $Si_{1-x}Ge_x$ layer at low temperatures and subsequently placing a capping layer of a material such as silicon over the as-grown $Si_{1-x}Ge_x$, it is possible to subsequently process the device at temperatures which provide process flexibility previously unanticipated.

There is an unexpected reduction in misfit dislocation generation provided by the epitaxially grown silicon capping layer. Use of such a capping layer on LRP grown $Si_{1-x}Ge_x$ films makes possible subsequent processing up to 900° C. for periods of one hour with no significant increase in the dislocation density. The minimum capping layer thickness for a significant reduction in misfit dislocation generation was estimated by comparing capped and uncapped films with similar misfit dislocation densities after annealing. An uncapped sample annealed for 15 seconds at 850° C. and a sample exposed to an 850° C. temperature for a time period of about 3 minutes during capping layer growth showed approximately equal dislocation densities. Assuming the dislocations were introduced during the first 15 seconds of growth, the minimum cap thickness for a reduction in dislocation generation is estimated to be more than about 200 Angstroms based on the silicon growth rate of about 15 Angstroms per second at 850° C.

The preferred embodiments disclosed and the particular process steps described do not provide all of the possible structures and process methods which can be used to practice the present invention. It is believed that with the disclosure provided herein one skilled in the art can utilize the concept of a restraining capping layer over a heteroepitaxial layer having a heterojunction with the substrate on which it is formed to enable subsequent processing of the structure at temperatures previously not contemplated. Variation in the composition of the heteroepitaxial layer and its substrate and capping layer, as well as variation in the overall semiconductor device structure are considered to be within the scope of the present invention which is defined only by the following claims.

What is claimed is:

1. A method of fabricating a device having at least one heteroepitaxial layer under strain, wherein processing of the device subsequent to growth of the heteroepitaxial layer is done at temperatures higher than the growth temperature of said heteroepitaxial layer and wherein the thickness of the strained heteroepitaxial layer is more than two times the equilibrium critical thickness for an uncapped heteroepitaxial layer upon a crystalline substrate, calculated from equilibrium theory for the uncapped layer, the method comprising the steps of:
    (a) providing a first crystalline substrate layer that comprises silicon;
    (b) forming a second heteroepitaxial layer upon the surface of the first crystalline layer, where the second layer is comprised of a material selected from the group consisting of silicon-germanium, gallium-arsenide, germaniumtin, indium-phosphide and indium-antimonide;
    (c) providing the second layer with oxygen atoms of concentration approximately $10^{20}$ cm$^{-3}$;
    (d) forming a thin third crystalline layer, which comprises silicon, upon the surface of the second heteroepitaxial layer so that the third layer substantially continuously binds to the crystal structure of the second heteroepitaxial layer while the second heteroepitaxial layer remains under strain; and
    (e) subsequently processing the resultant structure at temperatures higher than the growth temperature of the second heteroepitaxial layer;
    whereby the presence of the third crystalline layer prevents substantial formation of misfit dislocations at the interface between the first crystalline layer and the second heteroepitaxial layer which would occur in the absence of the third crystalline layer.

2. The method of claim 1, wherein said second heteroepitaxial layer is a silicon-germanium heteroepitaxial layer, and the germanium concentration in said silicon-germanium heteroepitaxial layer ranges from about 6 percent to about 50 percent.

3. The method of claim 2, wherein said germanium concentration in said silicon-germanium heteroepitaxial layer ranges from about 12 percent to about 35 percent.

4. The method of claim 2, wherein the thickness of said second heteroepitaxial layer is at least four times said calculated critical thickness of said uncapped heteroepitaxial layer.

5. The method of claim 2 wherein said step of subsequently processing (e) is accomplished at a temperature of at least 850° C.

6. The method of claim 5 wherein said step of subsequently processing (e) is accomplished at a temperature of at least 900° C.

7. The method of claim 6 wherein said step of subsequently processing (e) is accomplished at a temperature of at least 1,000° C.

8. The method of claim 1, wherein said third crystalline layer is epitaxially grown.

9. The method of claim 1, further comprising the step of providing said third crystalline layer with a thickness of at least 200 Å.

10. The method of claim 1, wherein said second heteroepitaxial layer has a thickness that is at least four times said calculated critical thickness of said uncapped heteroepitaxial layer, and said third crystalline layer is epitaxially grown.

11. A method of fabricating a device having at least one heteroepitaxial layer under strain, wherein processing of the device subsequent to growth of the heteroepitaxial layer is done at temperatures higher than the growth temperature of said heteroepitaxial layer and wherein the thickness of the strained heteroepitaxial layer is more than two times the equilibrium critical thickness for an uncapped heteroepitaxial layer upon a crystalline substrate, calculated from equilibrium theory for the uncapped layer, the method comprising the steps of:
    (a) providing a first crystalline substrate layer;
    (b) forming a second heteroepitaxial layer, containing a silicon-germanium material with a concentration of oxygen atoms of approximately $10^{20}$ cm$^{-3}$, upon the surface of the first crystalline layer;
    (c) forming a third crystalline layer upon the surface of the second heteroepitaxial layer so that the third layer substantially continuously binds to the crystal structure of the second heteroepitaxial layer while the second heteroepitaxial layer remains under strain; and
    (d) subsequently processing the resultant structure at temperatures higher than the growth temperature of the second heteroepitaxial layer;
    whereby the presence of the third crystalline layer prevents substantial formation of misfit dislocations at the interface between the first crystalline layer and the second heteroepitaxial layer which would occur in the absence of the third crystalline layer.

12. The method of claim 11, further comprising the step of choosing the material of at least one of said first crystalline layer and said third crystalline layer as silicon.

13. The method of claim 11, further comprising the step of choosing the concentration of said germanium in said second heteroepitaxial layer in the range 6 percent to 50 percent.

14. The method of claim 13 wherein said step of subsequently processing (d) is accomplished at a temperature of at least 850° C.

15. The method of claim 13 wherein said step of subsequently processing (d) is accomplished at a temperature of at least 1,000° C.

16. The method of claim 11, further comprising the step of forming said third crystalline layer as an epitaxial layer.

17. The method of claim 16 further comprising the steps of: forming said second heteroepitaxial layer at a second layer growth temperature; and forming said third crystalline layer at a third layer growth temperature that is higher than the second layer growth temperature.

18. A method of fabricating a device having at least one heteroepitaxial layer under strain, wherein processing of the device subsequent to growth of the heteroepitaxial layer is done at temperatures higher than the growth temperature of said heteroepitaxial layer and wherein the thickness of the strained heteropitaxial layer is more than two times the equilibrium critical thickness for an uncapped heteroepitaxial layer upon a crystalline substrate, calculated from equilibrium theory for the uncapped layer, the method comprising the steps of:

(a) providing a first crystalline substrate layer;

(b) forming a second heteroepitaxial layer upon the surface of the first crystalline layer by an LRP technique;

(c) forming a third crystalline layer upon the surface of the second heteroepitaxial layer so that the third layer substantially continously binds to the crystal structure of the second heteroepitaxial layer while the second heteroepitaxial layer remains under strain; and (d) subsequently processing the resultant structure at temperatures higher than the growth temperature of the second heteroepitaxial layer;

whereby the presence of the third crystalline layer prevents substantial formation of misfit dislocations at the interface between the first crystalline layer and the second heteroepitaxial layer which would occur in the absence of the third crystalline layer.

* * * * *